United States Patent [19]

Elmqvist

[11] Patent Number: 4,788,528
[45] Date of Patent: Nov. 29, 1988

[54] METHOD AND APPARATUS FOR HIGH-RESOLUTION DIGITIZATION OF A SIGNAL

[75] Inventor: Hakan Elmqvist, Bromma, Sweden

[73] Assignee: Siemens Aktiengesellschaft, Berlin and Munich, Fed. Rep. of Germany

[21] Appl. No.: 51,162

[22] Filed: May 15, 1987

Related U.S. Application Data

[63] Continuation of Ser. No. 775,314, Sep. 12, 1985, abandoned.

[30] Foreign Application Priority Data

Sep. 14, 1984 [DE] Fed. Rep. of Germany ....... 3433898

[51] Int. Cl.$^4$ ............................................... H03M 1/46
[52] U.S. Cl. ................................. 341/155; 364/723; 341/118
[58] Field of Search ....... 340/347 AD, 347 M, 347 C, 340/347 CC; 332/11 D; 375/27; 364/723

[56] References Cited

U.S. PATENT DOCUMENTS 3,913,016 10/1975 Candy ................... 375/75
4,393,369 7/1983 Davies ................. 340/347 AD
4,540,974 9/1985 Schanne et al. ............ 358/13 X

OTHER PUBLICATIONS

The Engineering Staff of Analog Devices, Inc., Analog–Digital Conversion Handbook, 6/1972, pp. I-34 to If-37.

Primary Examiner—T. J. Sloyan

[57] ABSTRACT

A method and apparatus for high-resolution digitization of a signal with a large dynamic range employ an analog-to-digital converter having a bit number and having a measuring region which is smaller than the total range of measurement of the incoming signal, the range of measurement being divided into smaller measuring segments which partially overlap, each measuring segment having a size corresponding to the measuring ranges of the analog-to-digital converter. The information from the analog-to-digital converter controls a measurement segment selector such that the signal to be converted into digital form is within the selected segment. A new digital signal value is extrapolated at least from the two last bits from the analog-to-digital converter.

9 Claims, 4 Drawing Sheets

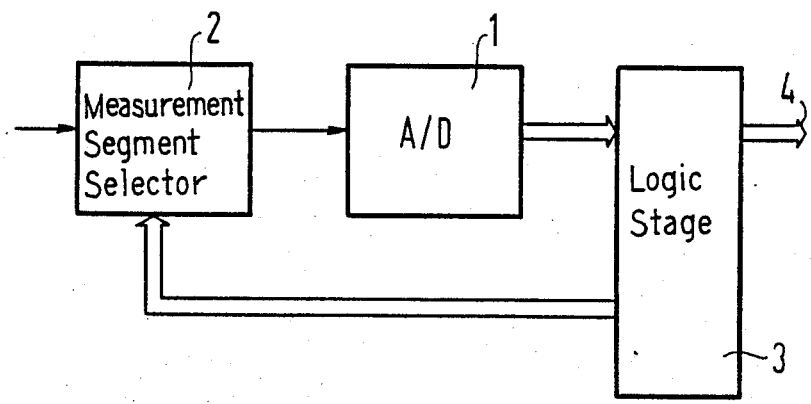
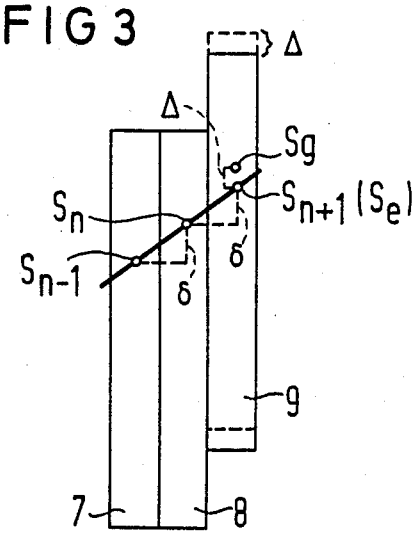

FIG 4a
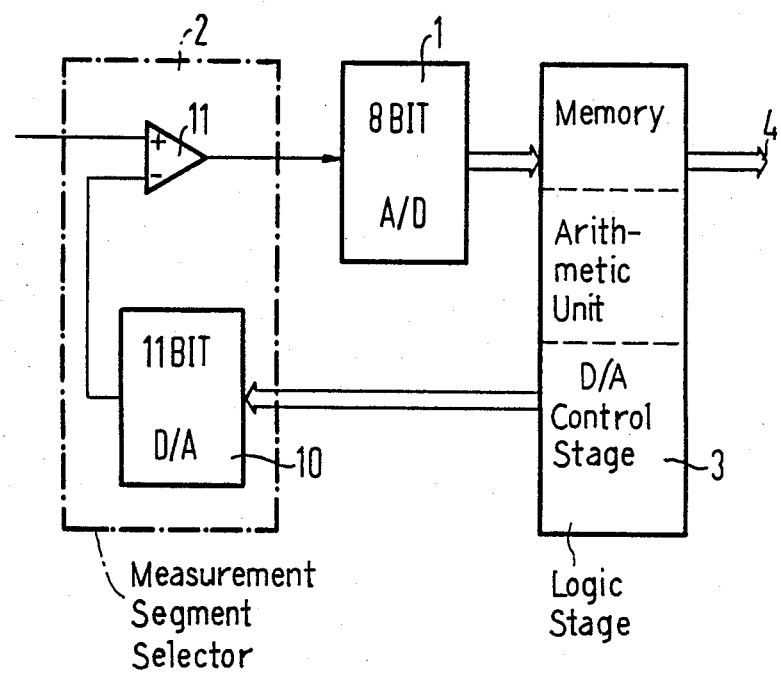
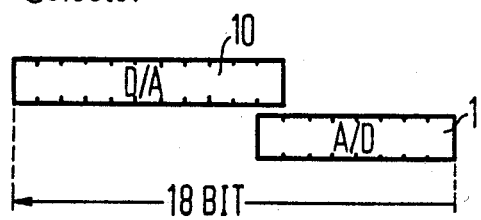
FIG 4b

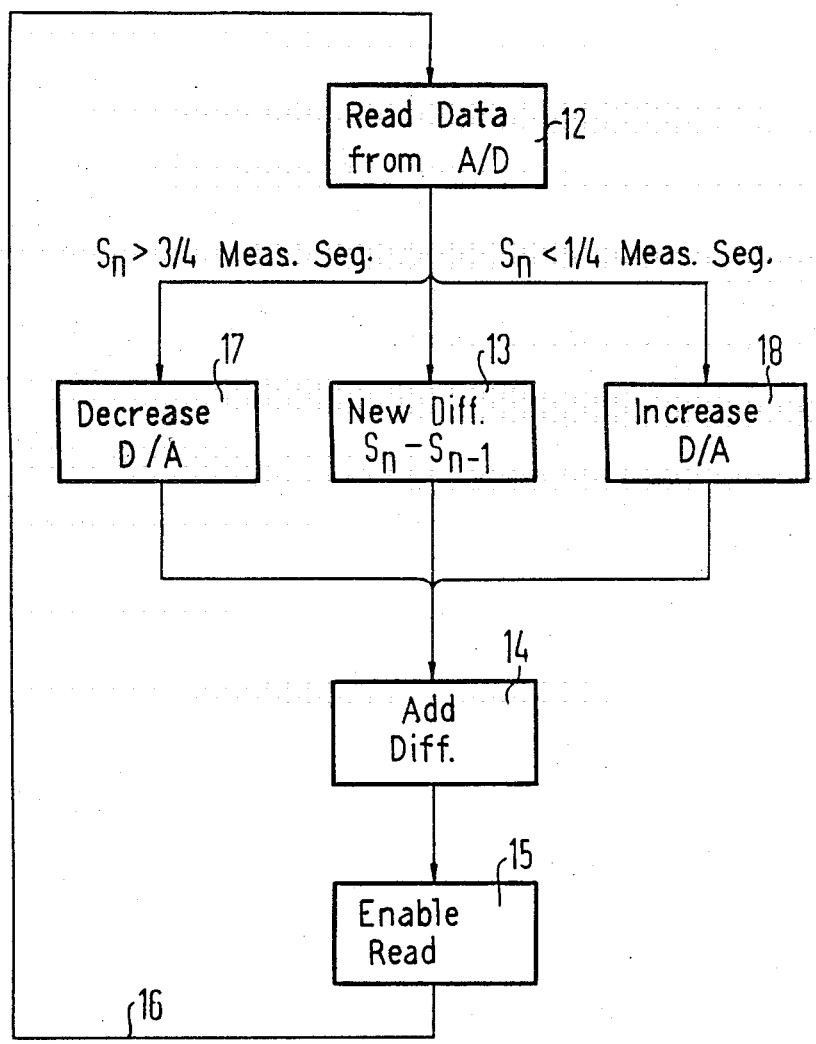

METHOD AND APPARATUS FOR HIGH-RESOLUTION DIGITIZATION OF A SIGNAL

This is a continuation of application Ser. No. 775,314, filed Sept. 12, 1985, now abandoned.

BACKGROUND OF THE INVENTION

1. Field of the Invention

The present invention relates to methods and devices for achieving high-resolution digitization of an incoming signal having a relatively large dynamic range employing an analog-to-digital converter (A/D converter).

2. Description of the Prior Art

Although high-resolution digitization of an incoming signal having a large dynamic range could be achieved by an A/D converter having an adequately high bit number which covers the entire range of measurement, such a converter would necessarily require unacceptably long conversion times, would moreover be extremely expensive in terms of material outlay.

SUMMARY OF THE INVENTION

It is an object of the present invention to provide a method and apparatus for high-resolution digitization of a signal having a large dynamic range which can be quickly and economically undertaken.

The above object is inventively achieved in a method and apparatus wherein the range of measurement is divided into smaller measurement segments and wherein an A/D converter having a reduced bit number is employed. The measuring region of the converter corresponds to the bit number for the size of the selected measurement segments. The digital output signal of the A/D converter controls a measurement segment selector such that the signal to be converted is disposed within the selected measurement segment. A discontinuity in the output signal can still arise at the interfaces between the individual measurement segments because the precision with which the position of the measurement segment in the total range of measurement can be set does not correspond to the high-resolution precision of the A/D converter. Such discontinuities can be avoided by overlapping the measurement segments to insure that the signal to be converted falls within a measurement segment. Such discontinuities can be substantially further eliminated by extrapolating a new digital signal value at least from the last two signals supplied by the A/D converter. In the simplest case, this can be accomplished by linear extrapolation between the last two values, however, additional information bits can also be employed, as can an algorithm which is better matched to the actual curve progression. If the scan frequency of the A/D converter is sufficiently high in comparison to the frequency range of the signal to be converted, the error between the actual signal value and the signal extrapolated from the preceding signal values can be made adequately small. The extrapolated signal value thus represents a reference for the subsequent signal values in the new measurement segment.

By means of this method, therefore, it is possible to achieve digitization of a signal over the entire range of measurement with fast and economical A/D converters with a substantially constant high-resolution. The extrapolated signal value can be directly employed as the first value in a modified measurement segment, i.e., at the interface which has uncertainties with respect to the measuring precision.

The consecutive differences of the signals can thus be measured independently of the absolute position of the measurement segment in the total range of measurement. The desired output signal, i.e., the desired digital value, is acquired by addition of these differences, but without an absolute reference.

In a further embodiment of the invention the signal value is measured immediately after the change of the measurement segment, and the initial value for the next difference formation is not extrapolated.

For measurement of absolute value, the possible error at the interfaces between measurement segments can be eliminated by forming the difference between the extrapolated signal value and the first measured value acquired in the new measurement segment. This difference is employed for correcting the signal values of the current measurement segment. The absolute value is obtained from this corrected signal in combination with the value relating to the position of the segment.

In an apparatus for practicing the above method, a measurement segment selector having a differential amplifier and a digital-to-analog converter (D/A converter) is provided, with the signal to be converted being supplied to one input of the differential amplifier and the output signal of the D/A converter being connected to the other differential amplifier input. When a limit value in the output signal of the A/D converter is passed, the differential amplifier switches by a bit corresponding to the desired change of measurement segment. The resolution of the D/A converter therefore need only correspond to the measurement segments. The possible error which must thereby be accepted is based on the fact that the D/A converters unavoidably have an error corresponding to approximately half of the least significant bit. Without using the above-described method, therefore, such a circuit would not be useful.

The advantages attained with the method and apparatus disclosed herein are particularly highlighted when a logic stage is provided to which the output signal of the A/D converter is supplied. The logic stage stores the required values, calculates the differences and extrapolated signal values, continuously adds these values under different conditions, and may employ the results of the calculations for correcting the values to be converted. The logic stage also controls the D/A converter for switching measurement segments depending upon the entered limit value. The logic stage may, under certain conditions, employ the value from the D/A converter for formation of an absolute digital signal value. All of these features can be undertaken by means of a microprocessor in one embodiment of the apparatus. The A/D converter can be calibrated by means of the microprocessor through the D/A converter.

DESCRIPTION OF THE DRAWINGS

FIG. 1 is a schematic diagram of an apparatus for practicing the method disclosed herein.

FIG. 3 is a further diagram for explaining the method disclosed herein.

FIG. 4a is a schematic diagram showing further details of the apparatus shown in FIG. 1.

FIG. 4b is a diagram showing the resolution of the apparatus shown in FIG. 4a.

FIG. 5 is a flowchart for explaining the method disclosed herein.

DESCRIPTION OF THE PREFERRED EMBODIMENTS

An apparatus for high-resolution digitization of an incoming analog signal is schematically shown in FIG. 1. The apparatus includes an A/D converter 1 to which the signal to be converted is supplied through a measurement segment selector 2. The output signal of the A/D converter 1 is supplied to a logic stage 3 which controls the measurement segment selector 2 and also supplies the digital output signal at an output line 4.

Figure 2B:
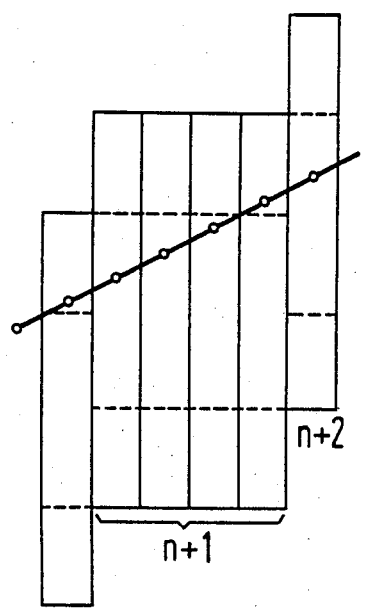
FIG. 2b is an enlarged portion of the curve shown in FIG. 2a showing the digitization method in accordance with the principles of the present invention.
Figure 2A:
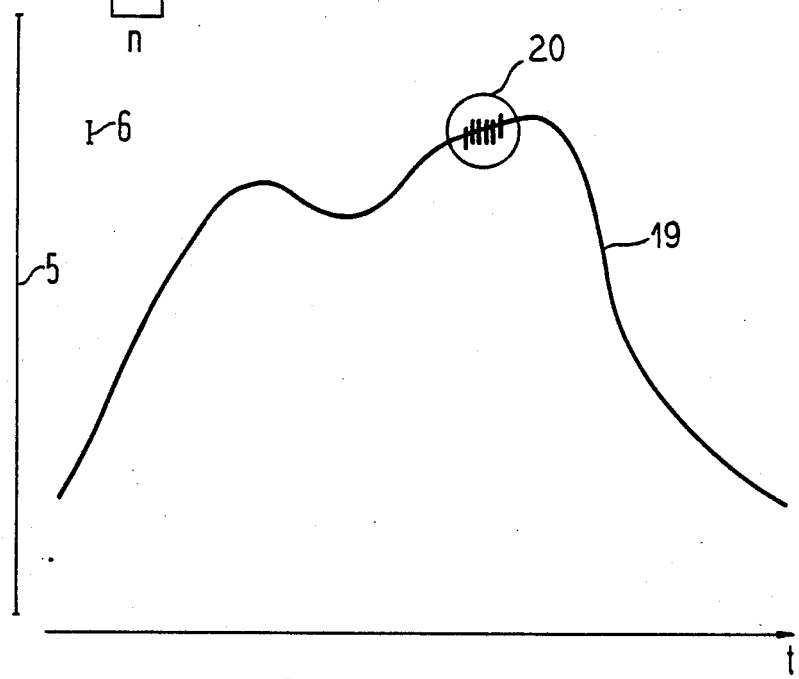
FIG. 2a is an analog signal over time to be digitized.

FIG. 2a shows a possible analog signal curve shown over time t. The axis 5 indicates the total range of measurement, i.e., the dynamic range. The line 6 shown next to the axis 5 is in the same scale and reflects the size of the measurement segment employed. A series of adjacent measurement segments are shown along the curve in the central region of the signal indicated by the circle 20. As can be seen therefrom, the individual measurement segments overlap. The portion of FIG. 2a within the circle 20 is shown in detail in FIG. 2b. For simplicity, a segment of the curve 19 has been selected wherein the signal to be converted has a substantially linear progression. The left-most measurement segment is referenced n. The four following segments are referenced n+1, and the right-most measuring segment is referenced n+2. As can be seen in the enlarged excerpt shown in FIG. 2b, a change to the next measurement segment occurs when the measured value proceeds into the boundary region, indicated with dashed lines, of the measuring segment. When this occurs, the next measuring segment is changed. In the embodiment of FIG. 2b, the different measurement segments overlap by ¾ of the size of a measuring segment. Other overlaps of the measurement segments are possible within the method disclosed herein. When the signal to be converted is less than ¼ of the size of the measurement segment, or greater than ¾ of this size, the measurement segment selector will select a different measurement segment which is shifted either one step down or one step up. The measurement segments are retained unaltered as long as the signal stays within the central region of the measurement segments, between the dashed lines.

The method of the invention will be explained in greater detail with reference to FIG. 3. Again there are shown therein segments 7, 8 and 9 as well as three signal values $S_{n-1}$, $S_n$ and $S_{n+1}$. A linear signal progression has again been assumed. It has also been assumed that the measured value $S_n$ is within the boundary region of the measurement segment 8, and therefore a change of measurement segment is undertaken. The theoretically correctly shifted measurement segment 9 is shown with dashed lines. The solid lines indicate the actual position of the measurement segment 9 obtained by the possible error of the measurement segment selector. The extrapolated signal value is referenced $S_e$, corresponding to the actual signal value when the error in the extrapolation is not considered. The signal $S_g$ indicates the signal value measured by the incorrectly disposed measurement segment. This signal value can deviate significantly from the actual signal value. The differences between the adjacent signal values are indicated with the symbol $\delta$. The symbol $\Delta$ indicates the error in the position of the changed measurement segment 9.

As can be seen in FIG. 3, the signal value to be defined can be obtained either by constantly adding the differences between adjacent signal values, or by extrapolating the difference referenced $\Delta$ between the extrapolated and the actually measured value. This difference can be utilized for correcting the signal value obtained in each newly established measurement segment.

In FIG. 4, components identical to those already described in connection with FIG. 1 are provided with the same reference symbols. In FIG. 4, a digitization with a resolution of 18 bits is to be undertaken using an 8 bit A/D converter, and a measurement segment selector having an 11 bit D/A converter 10 and a differential amplifier 11. The most significant bits of the D/A converter determine the selection of the measurement segment, with the value of the D/A converter being changed by one step which corresponds to half of the measuring region of the A/D converter. The A/D converter 1 and D/A converter 10 are shown as two columns in FIG. 4b. In combination, the two converters cover 18 bits, corresponding to the required resolution over the full dynamic range. Due to the far higher reference voltage at the D/A converter 10, the least significant bit of the D/A converter 10 supplies an analog signal which achieves a level shift of the signal to be converted in an amount in the differential amplifier 11 which precisely corresponds to the desired ¼ of the measurement region of the A/D converter. Through the logic stage 3, the most significant bits of the A/D converter 1 define at what time, and in what direction, the value of the D/A converter, and thus of the measurement segment, is to be changed.

FIG. 5 shows a flowchart identifying the steps which the logic stage of FIG. 4 executes. In a first step, data ($S_n$) from the A/D converter is entered, as indicated in block 12. When the value $S_n$ is outside of the boundary region of the A/D converter, as indicated in block 13 a new difference between this value $S_n$ and the preceding value $S_{n-1}$ is directly formed. A reorganization of the values is then undertaken such that the most recently entered value $S_n$ becomes the new value $S_{-1}$. When another value $S_n$ is entered again in the next clock sequence, the difference is again formed, and so on. As indicated by the block 14, these differences are added, for example in a buffer stage. The output signal of the buffer stage, which corresponds to the sum of all differences and thus to the alternating voltage component of the signal to be converted, is supplied as an output through a further stage 15. Entry of a new value from the A/D converter is enabled via the line 16.

When the entered value $S_n$ is greater than ¾ of the measurement segment, or smaller than ¼ thereof, i.e., when the value to be converted is within the boundary region of the D/A converter, direct access to the difference-forming stage is inhibited. In this case, the value from the D/A converter is either reduced or incremented by blocks 17 or 18. Because no new differences formed, the most recently existing difference is supplied to the buffer stage, and is thus added to the existing value. The two-time use of the same difference thus corresponds to a linear extrapolation to form a new signal value.

Although modifications and changes may be suggested by those skilled in the art it is the intention of the inventor to embody within the patent warranted hereon all changes and modifications as reasonably and properly come within the scope of his contribution to the art.

I claim as my invention:

1. A method for digitization of an analog signal to a required degree of high-resolution with a large dynamic range using an analog-to-digital coverter having a measuring region smaller than the total range of measurement of the analog signal comprising the steps of:
   dividing said range of measurement into a plurality of smaller partially overlapping measurement segments, each measurement segment having a size corresponding to the measuring range of the analog-to-digital converter and an error bigger in size than the required degree of high-resolution;
   utilizing the analog-to-digital converter to control selection of said measurement segments such that the analog signal to be digitized is within selected limits of a current selected segment;
   changing to another measurement segment if said analog signal is beyond said selected limits of said current selected segment; and
   if a change in said measurement segment is made, extrapolating a new digital signal value from at least the last two signals from said analog-to-digital converter.

2. A method as claimed in claim 1 comprising the additional step of utilizing the extrapolated signal value as a first value for a new measurement segment.

3. A method as claimed in claim 1 comprising the additional steps of:
   forming the difference between a current signal value from said analog-to-digital converter and a preceding signal value from said analog-to-digital converter; and continuously adding said differences.

4. A method as claimed in claim 3 comprising the additional step of utilizing a signal value from said analog-to-digital converter occurring immediately after a change in selected measurement segments without extrapolation as an initial value for the next difference formation.

5. A method as claimed in claim 1 comprising the additional steps of:
   forming the difference between the extrapolated signal value and a first signal value acquired in a new selected measurement segment; and
   utilizing said difference for correcting the position of said measurement segment arising due to error.

6. An apparatus for high-resolution digitization of an analog signal comprising:
   an analog-to-digital converter having a measurement region smaller than said dynamic range; and
   a measurement segment selector controlled by the output of said analog-to-digital converter including means for dividing said dynamic range into a plurality of partially overlapping measurement segments corresponding to the size of the measurement region of said analog-to-digital converter, means for selecting a current measurement segment such that the signal to be digitized is within selected limits of said current measurement segment, and switching means for changing from said current measurement segment to another measurement segment when the output signal of said analog-to-digital converter exceeds said selected limit.

7. An apparatus as claimed in claim 6 further comprising a logic stage connected to the output of said analog-to-digital converter and to a control input of said measurement segment selector, said logic stage having means for storing the output signal of said analog-to-digital converter, means for calculating the differences between successive output signals of said converter and for forming extrapolated signal values therefrom, means for calculating differences between successively stored signals, means for continuously adding, the differences, and means for controlling selection of measurement segments in said measurement segment selector based on the result of said continuous addition.

8. An apparatus as claimed in claim 7 wherein said logic stage further includes means for forming an absolute digital signal value from said continuously added values for correcting for digitization errors in said analog-to-digital converter.

9. An apparatus as claimed in claim 7 wherein said logic stage is a microprocessor.

* * * * *